(12) United States Patent
Lee et al.

(10) Patent No.: US 9,356,582 B2
(45) Date of Patent: May 31, 2016

(54) LOW JITTER TUNABLE VOLTAGE CONTROL OSCILLATOR WITH SELF CALIBRATION CIRCUITS TO REDUCE CHIP FABRICATION PROCESS VARIATION

(71) Applicant: THE REGENTS OF THE UNIVERSITY OF CALIFORNIA, Oakland, CA (US)

(72) Inventors: Sheau Jiung Lee, Saratoga, CA (US); Yilei Li, Los Angeles, CA (US); Gabriel Virbila, Venice, CA (US); Mau-Chung Frank Chang, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/850,506

(22) Filed: Sep. 10, 2015

(65) Prior Publication Data

US 2016/0072482 A1    Mar. 10, 2016

Related U.S. Application Data

(63) Continuation of application No. PCT/US2014/018522, filed on Feb. 26, 2014.

(60) Provisional application No. 61/776,481, filed on Mar. 11, 2013.

(51) Int. Cl.
*H03K 3/03* (2006.01)

(52) U.S. Cl.
CPC .................... *H03K 3/0315* (2013.01)

(58) Field of Classification Search
CPC ........................................ H03K 3/0315
USPC ........................................ 331/57; 324/73.1
See application file for complete search history.

(56) References Cited

U.S. PATENT DOCUMENTS

| | | | |
|---|---|---|---|
| 2011/0215875 A1* | 9/2011 | Yagishita | H03L 7/00 331/34 |
| 2012/0119821 A1* | 5/2012 | Den Besten | H04L 25/0298 327/534 |
| 2014/0292301 A1* | 10/2014 | Lee | H03B 5/1228 323/299 |

FOREIGN PATENT DOCUMENTS

| | | |
|---|---|---|
| JP | 2000-049597 A | 2/2000 |
| JP | 2003-078410 A | 3/2003 |

(Continued)

OTHER PUBLICATIONS

Korea Intellectual Property Office (KIPO), International Search Report and Written Opinion, PCT/US2014/018522, issued Jun. 20, 2014, pp. 1-10, with claims searched, pp. 11-16. This application is a continuation of the foregoing PCT application. The degree of relevance of the non-English language references listed above is set forth in this English-language search report and, therefore, a separate concise explanation of the relevance is not required.

*Primary Examiner* — Joseph Chang
(74) *Attorney, Agent, or Firm* — John P. O'Banion

(57) ABSTRACT

A voltage controlled oscillator (VCO) which can be configured with a smaller tuning range than is ordinarily required is presented. Ordinarily, the tuning range is selected much broader than the application warrants so that sufficient range is still provided despite VCO process variations. The inventive VCO is able to substantially eliminate the effects of process variation by utilizing a calibration circuit and process, so that variation in VCO device operation is minimized despite substantial process variation. Accordingly, the inventive VCO device is subject to reduced levels of jitter as its range need not be utilized for overcoming process variation arising during device fabrication.

20 Claims, 10 Drawing Sheets

(56) References Cited

FOREIGN PATENT DOCUMENTS

| | | |
|---|---|---|
| JP | 2004-200742 A | 7/2004 |
| JP | 2006-033917 A | 2/2006 |
| JP | 2008-085534 A | 4/2008 |

* cited by examiner

LOW JITTER TUNABLE VOLTAGE CONTROL OSCILLATOR WITH SELF CALIBRATION CIRCUITS TO REDUCE CHIP FABRICATION PROCESS VARIATION

CROSS-REFERENCE TO RELATED APPLICATIONS

This application is a 35 U.S.C. §111(a) continuation of PCT international application number PCT/US2014/018522 filed on Feb. 26, 2014, incorporated herein by reference in its entirety, which claims priority to, and the benefit of, U.S. provisional patent application Ser. No. 61/776,481 filed on Mar. 11, 2013, incorporated herein by reference in its entirety. Priority is claimed to each of the foregoing applications.

The above-referenced PCT international application was published as PCT International Publication No. WO 2014/163881 on Oct. 9, 2014, which publication is incorporated herein by reference in its entirety.

STATEMENT REGARDING FEDERALLY SPONSORED RESEARCH OR DEVELOPMENT

Not Applicable

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to a voltage controlled oscillator (VCO), and more particularly to a VCO configured for compensating for device process variations.

2. Description of Related Art

A voltage controlled oscillator (VCO) is an electronic oscillator whose oscillation frequency is controlled by a voltage input, with the applied input voltage determining the instantaneous oscillation frequency. Thus, modulating signals applied to the control input can be utilized to create frequency modulation (FM) or phase modulation (PM), or as part of a phase-locked loop, or in a wide range of other applications.

A VCO consisting of a chain of digital inverter rings is considered to have higher jitter compared with VCO with L-C tank circuits. Despite these shortcomings, the ring-type VCO is widely used in integrated circuits, due to its much smaller chip size as a logic circuit. Typical ring-type VCOs utilize a diode to limit the voltage swing toward achieving some degree of control over operation variation. However, even the characteristics of these diodes vary as fabrication processes change.

Accordingly, a need exists for a VCO which provides low jitter by overcoming fabrication process variations.

BRIEF SUMMARY OF THE INVENTION

A tunable voltage controlled oscillator (VCO) is a key circuit block for frequency synthesizers and phase lock loop in integrated circuit chips. It can also be utilized in a number of other applications (e.g., FM or PM modulation, function/tone/music generators, phase-locked loops (PLLs), clock and data recover (CDR) circuits, frequency synthesizers (e.g., communication equipment), voltage to frequency converters (VFC), and so forth).

A tunable VCO providing low jitter can improve system performance significantly. In order to achieve low jitter performance in a VCO, the $K_{VCO}$ (frequency gain by control voltage) should be kept as small as possible over the target tuning frequency range. However, due to the existence of chip fabrication process variation, devices must be fabricated with substantially larger $K_{VCO}$ values to cover not only the target tuning frequency range but also the chip fabrication process variation. Typical process variation is about a 50% difference between slow-slow process corner and fast-fast process corner. If a VCO is designed for a 20% frequency tuning range, then due to process variation, $K_{VCO}$ must span a 70% tuning range instead of a 20% target tuning range. As a result, the unnecessarily high $K_{VCO}$, which ensures a high production yield despite fabrication process variation, leads to substantial VCO jitter. Thus, in the present invention, $K_{VCO}$ can be kept smaller, as it does not need to be expanded beyond the target tuning frequency range to overcome tuning frequency changes caused by process variation.

The present invention is a tunable VCO which compensates for process variation by utilizing a novel architecture coupled with a self calibration circuit. This calibration of the VCO significantly reduces the effects of fabrication process variation and allows implementation of a VCO with low $K_{VCO}$ to cover the target tuning range. This implementation of VCO can significantly reduce jitter for a given target tuning range and span a wide range of chip fabrication processes.

The self calibration is realized by implementing feedback control circuits to create a constant RC delay for each stage of current mode inverter inside VCO. The method of combining the feedback control circuit and calibration circuit prevents the $K_{VCO}$ characteristic of the VCO from changing. The reduction of RC delay variation allows the value of $K_{VCO}$ to be minimized for a given device. Therefore, one can design a VCO with low $K_{VCO}$ to cover the target tuning frequency range despite the existence of process variation.

The self calibration circuit of the present invention provides a constant RC delay for current mode inverters inside a ring oscillator, as well as providing a constant voltage swing. This invention optimizes the performance of ring-type VCOs for any given fabrication process.

One unique element of the invention is that it creates a constant RC time for current mode logic inverters by utilizing automatic feedback circuits which emulate the external constant device to reduce the variation caused by the fabrication process variation. This invention not only optimizes the performance for a given process but also allows one to transport the design to different foundries. It will be appreciated that process variation within a given foundry is less than the process variation from one foundry to another foundry. In summary, this invention allows high performance and high manufacturing yield to be achieved using even simple ring-type VCOs.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Figure 1:
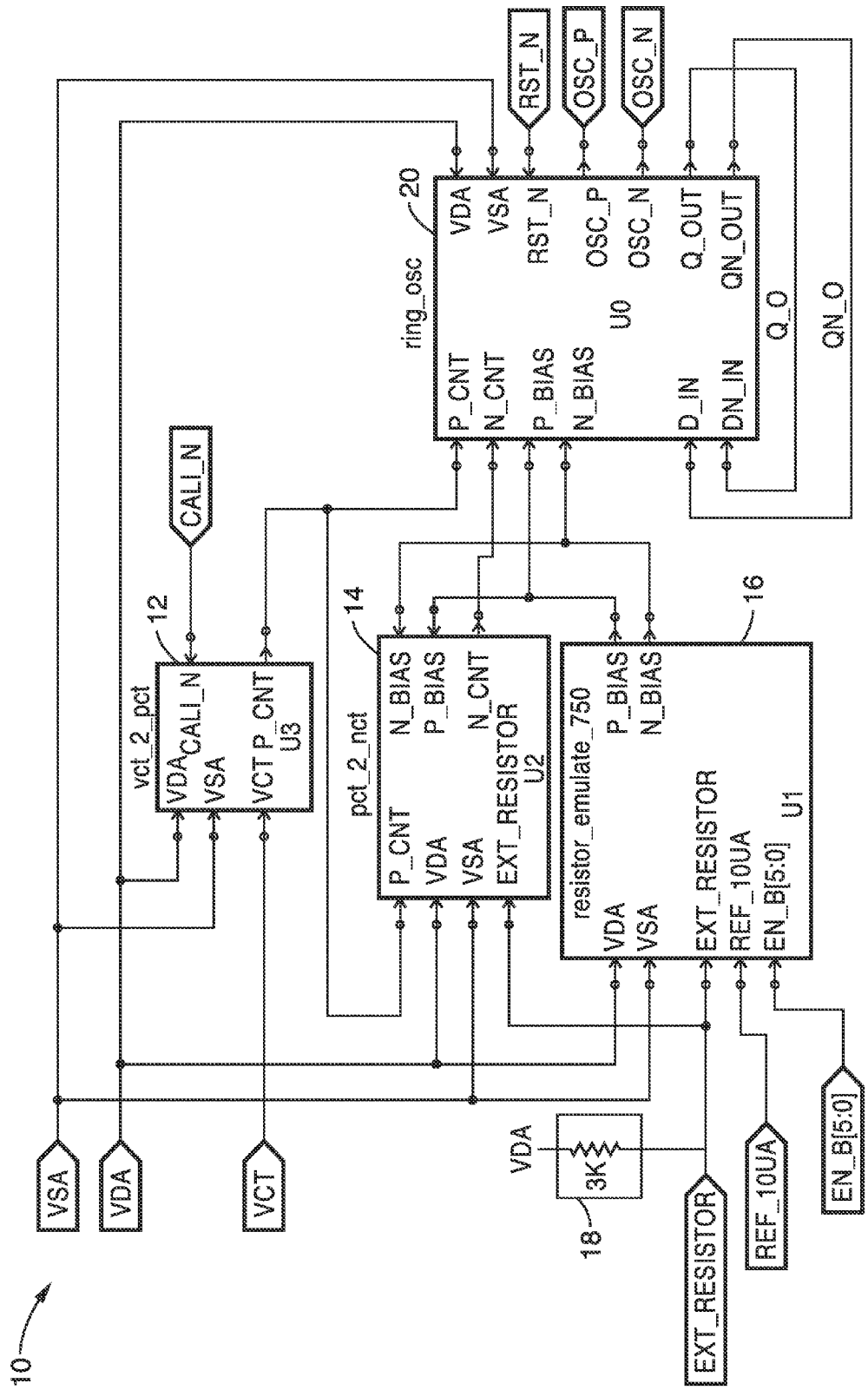
FIG. 1 is a schematic of a voltage controlled oscillator (VCO) according to an embodiment of the present invention.

FIG. 1 illustrates an example embodiment 10 of the inventive voltage controlled oscillator (VCO) circuit. The VCO outputs a frequency (differential output OSC_P and OSC_N) in response to the voltage applied to its input (VCT). The oscillation frequency of a VCO circuit can be generally represented as:

$$f_{vco} = f_0 + K_{vco} V_{CT} \quad (1)$$

in which $f_{vco}$ is the frequency output by the VCO circuit in response to the center frequency $f_0$ of the VCO offset by a VCO constant $K_{vco}$ times the input control voltage $V_{CT}$, herein represented simply as VCT. Thus, changing the input voltage VCT causes a proportional change in the output frequency of the VCO.

Example VCO circuit embodiment 10 is configured with four primary circuit elements: an amplifier 12, an adaptive bias current generator circuit 14 for keeping a constant voltage swing, a resistor emulator 16 operating in combination with resistor 18, and a ring oscillator circuit 20.

At the core of the VCO circuit is a variable oscillator. In the present invention a current mode logic (CML) ring oscillator 20 is preferably utilized, as it can be fabricated in a small area in a compatible process. CML ring oscillators can be implemented in various device technologies, such as BiPolar, MOS, and so forth. By way of example, and not limitation, the ring oscillator utilized herein is preferably configured using some form of MOS transistors. It will be appreciated that current mode logic (CML) is a fully differential logic having differential inputs and outputs, whose operation depends on current steering. Thus, the other circuits shown in FIG. 1, operate to control ring oscillator operation, including both its frequency and swing, toward matching ideal VCO operation seen in Eq. 1. In addition, the present invention is configured to reduce variation of VCO operation, which would otherwise require the use of larger $K_{vco}$ values to overcome chip fabrication process variations.

Amplifier 12 (vct_2_pct) is a buffer amplifying the control voltage VCT from low pass filter to output P_CNT. Signal N_CNT is generated by pct_2_nct block (block 14 in FIG. 1) based on the P_CNT input to guarantee constant VCO output swing with any given P_CNT. Signal P_CNT changes the resistance of PMOS devices and current in current mode logic (CML) inverter, within the ring oscillator 20. By varying P_CNT, CML inverters, such as utilizing PMOS transistors in the ring oscillator, operate with different delay times as P_CNT changes. When P_CNT fully turns on (maximum conductance) PMOS transistors increase current in the CML inverters to its maximum, then the CML inverters operate with their shortest delay time. When P_CNT fully turns off (minimum conductance) the PMOS transistors, the current in the CML inverters is reduced to minimums, and the CML inverters operate with their longest delay time. The control pin, CALI_N, provides the control mechanism to the self calibration controller during the calibration operation. Drain and source power supply voltages $V_{DA}$ (VDA) and $V_{SA}$ (VSA) are shown coupled to circuits 12, 14, 16 and 20. One of ordinarily skill in the art will appreciate that the CML ring oscillator of the present invention may be implemented from inverters comprising transistors other than PMOS transistors.

The adaptive bias current generator 14 (pct_2_nct) controls VCO frequency and maintains a constant voltage swing for the CML inverter during P_CNT changes, as described in detail in a later section. Constant swing is maintained because the adaptive bias current generator adjusts bias current based on resistor emulation output and control voltage. The voltage swing of CML in the ring oscillator stages is equal to current times resistance of the loaded device (i.e., V=I×R). When P_CNT changes to reduce the resistance of loaded devices in the CML inverter to increase ring oscillation frequency, then adaptive bias current generator circuit 14 generates more current to the CML inverters through signal N_CNT, such that the voltage swing is maintained as a constant. This circuit ensures the same circuit operating point so that all parasitic contributions to circuit operation are the same even when P_CNT changes. It will be appreciated then that P_CNT and N_CNT are generated by a sort of 'fake' ring oscillator (replica of ring-oscillator delay cell for bias), but they are not pseudo-differential.

The resistor emulator circuit 16 (resistor_emulate_750) performs resistor emulation toward overcoming process variation. A resistor 18, coupled to line EXT_RESISTOR, that is external to the emulator chip and exemplified as 3 kilo-ohm, is pulled up to the power supply, shown as the drain voltage VDA. It should be appreciated that the resistance value of resistance 18 is solely determined by the design and is only exemplified as, but not limited to, a 3 kilo-ohm value. An external current source (REF_10 UA) is applied to emulator circuit 16, which is exemplified as a 10 μA reference current, although the present invention may be configured for use with other reference source types and current levels without limitation. It should be appreciated that by utilizing an accurate external current source, and an accurate external resistor, that an accurate reference voltage is produced for tracking bias. With reference to the accurate reference voltage produced by those two external components, the internal loading device can be programmed accordingly to compensate for fabrication process variations. The details of these operating principles will be described in a later paragraph. This circuit has a programming control (EN_B[5:0]) utilized by the self calibration controller in FIG. 4 to control the bias current under the fixed voltage swing. Although this programming control is exemplified as a 6 bit control bus, it will be appreciated that programming control can be achieved utilizing different number of bits and/or differing communication formats (e.g., serial) as will be recognized by one of ordinary skill in the art.

Figure 2A:
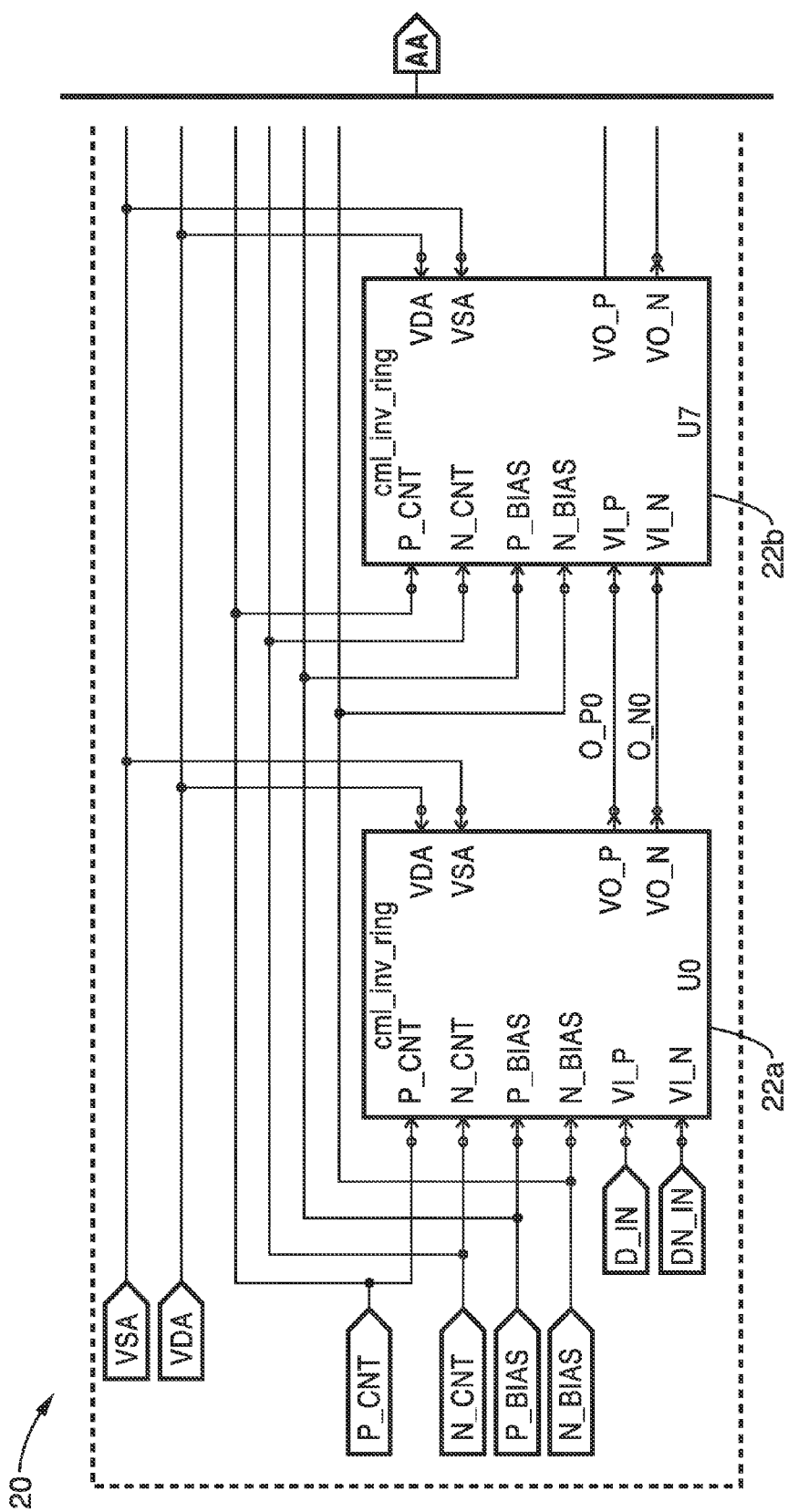
FIG. 2A through FIG. 2D is a schematic of a ring oscillator formed with an inverter chain, within the voltage controlled oscillator (VCO), according to an embodiment of the present invention.
Figure 2B:
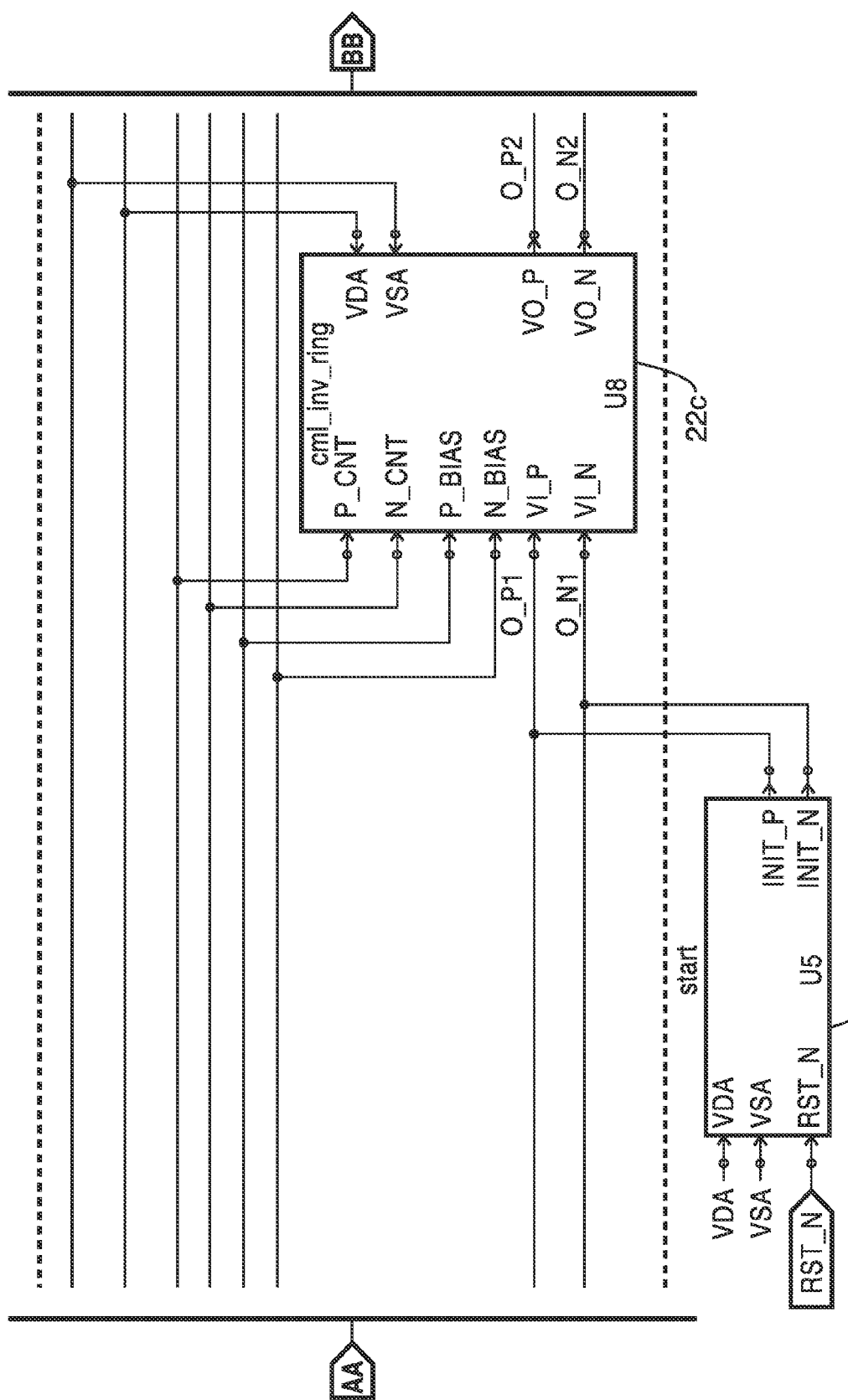
Figure 2C:
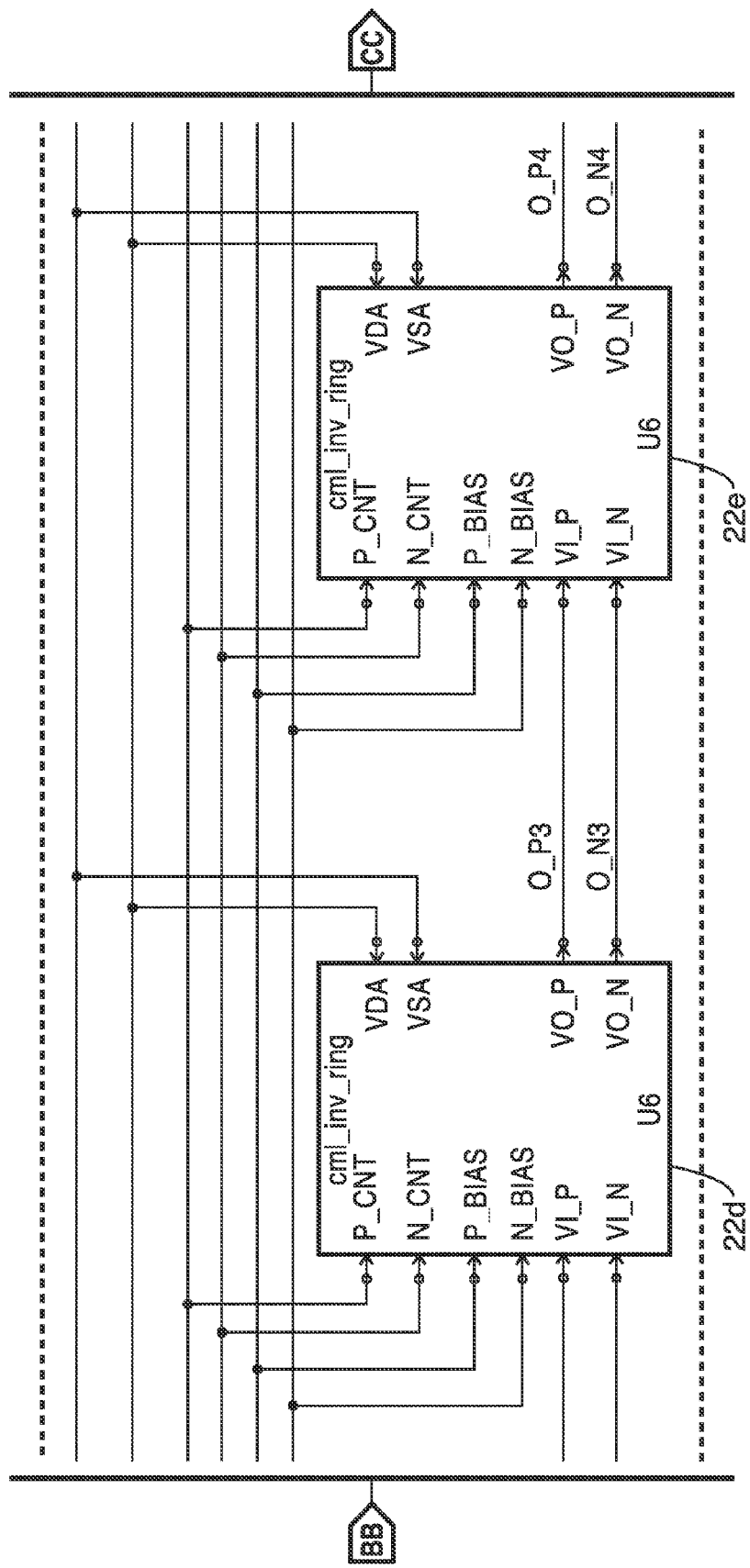
Figure 2D:
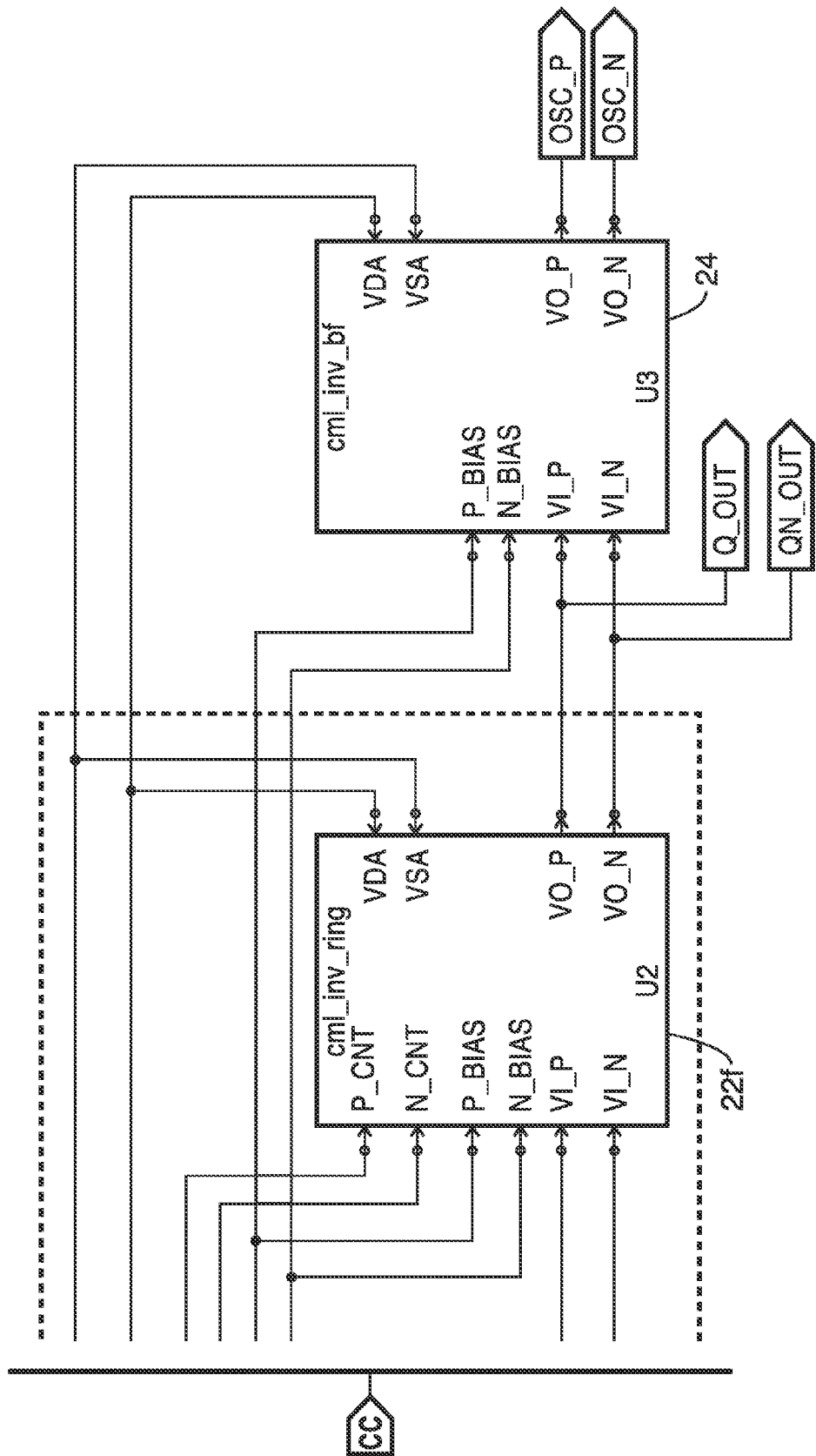

FIG. 2A through FIG. 2D illustrate a ring oscillator 20 as a chain of several stages (22a, 22b, 22c, 22d, 22e, 22f) of CML inverters. Oscillator circuit 20 in FIG. 2 is exemplified as a ring oscillator having several stages of CML inverter (e.g., utilizing PMOS transistors) and CML buffer. Although many ring oscillators have an odd number of stages, it should be appreciated that a ring oscillator may have an even number of stages as long as the output of each delay cell is differential. D_IN and DN_IN are the input of the ring, while Q_OUT and QN_OUT are the outputs of the ring. When the ring is connected as a loop to oscillate, then D_IN is connected to the QN_OUT and DN_IN is connected to Q_OUT. Component 24 in FIG. 2D is an output buffer which is able to drive relatively large loads. Its input is Q_OUT and QN_OUT, while its output is OSC_P and OSC_N. Component 26 in FIG. 2B is a starter for the ring oscillator, which ties the internal nodes of ring oscillator to proper voltage to start oscillation.

Each stage of CML inverters in the ring oscillator has a delay of Td given as follows:

$$T_d \propto C \times (\text{Swing/current}) \quad (2)$$

The amount of delay represented by $T_d$ (Td) is seen dependent on (proportional to) the value which includes C as total node capacitance, Swing as the difference of highest voltage and lowest voltage in the oscillation wave form, and current as the current supplied to each CML inverter, which is the current signal through NMOS transistors I30, I31 seen in FIG. 3B, described later in more detail. Since the swing is fixed by circuits 14, 16, described in FIG. 1, and the node capacitance C is fixed by device size, the current supplied to the CML inverters change as N_CNT changes. Where P_CNT changes, N_CNT also changes. This shows that by changing VCT, current and Td changes as well. Once Td changes, the frequency of the VCO changes. The frequency of the VCO is proven to be inversely proportional to twice the sum of Td in each stage of the inverter chain.

From the above analysis, if one maintains the voltage swing as a constant so that the swing does not change as the process changes, one can program the current by resistor emulator circuit 16 to compensate for the capacitance loading changes due to process variation. By such calibration, it is possible to minimize the value of $K_{vco}$ (seen in Eq. 1) for a given tuning range, because the process variation has been compensated for and thus $K_{vco}$ only needs to span the intended tuning range. As a result of being able to lower the necessary value of $K_{vco}$, the VCO design achieves lower VCO jitter.

Figure 3A:
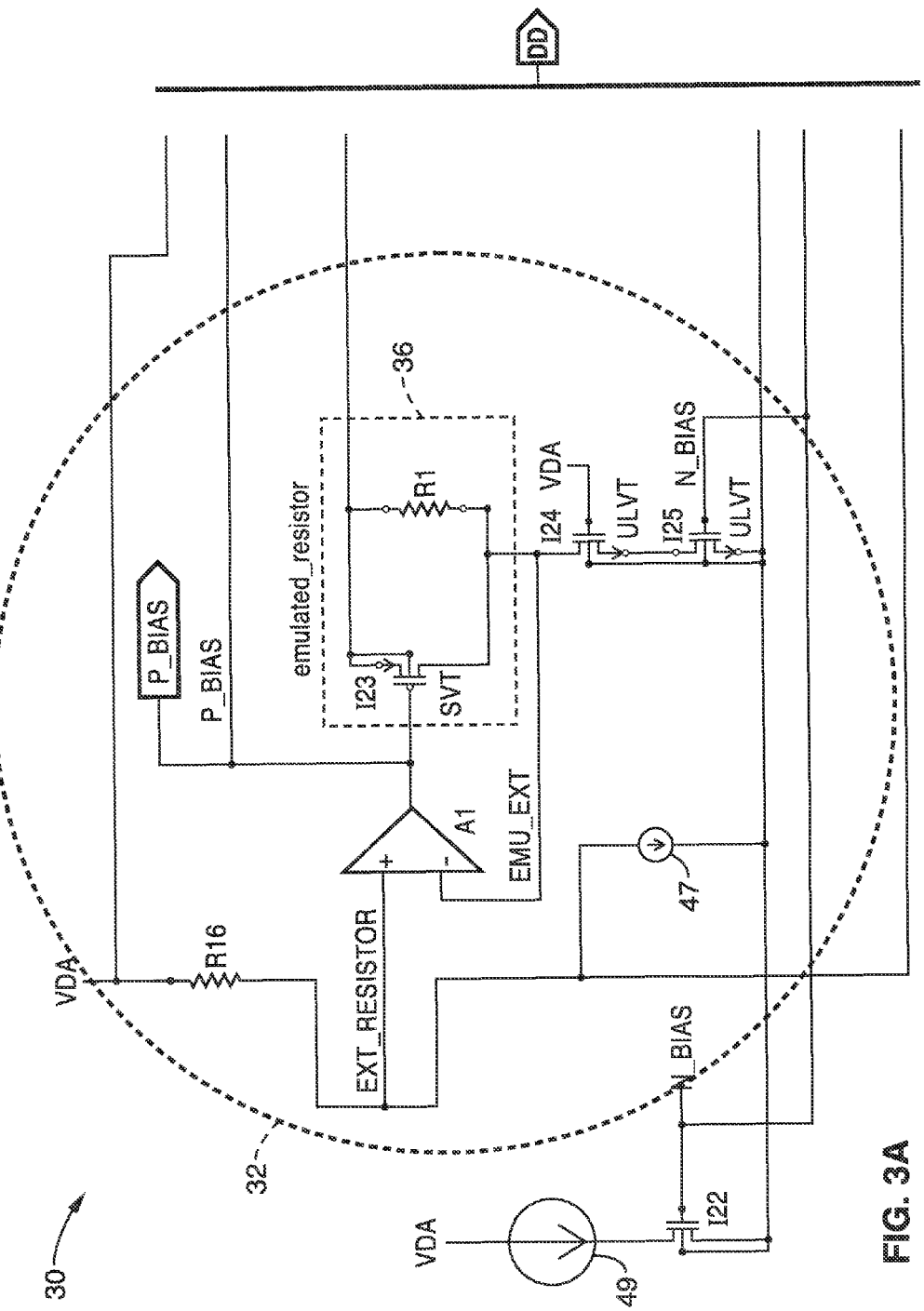
FIG. 3A through FIG. 3C is a schematic of a circuit for resistor emulation and N_CNT generation within the voltage controlled oscillator (VCO), according to an embodiment of the present invention.
Figure 3B:
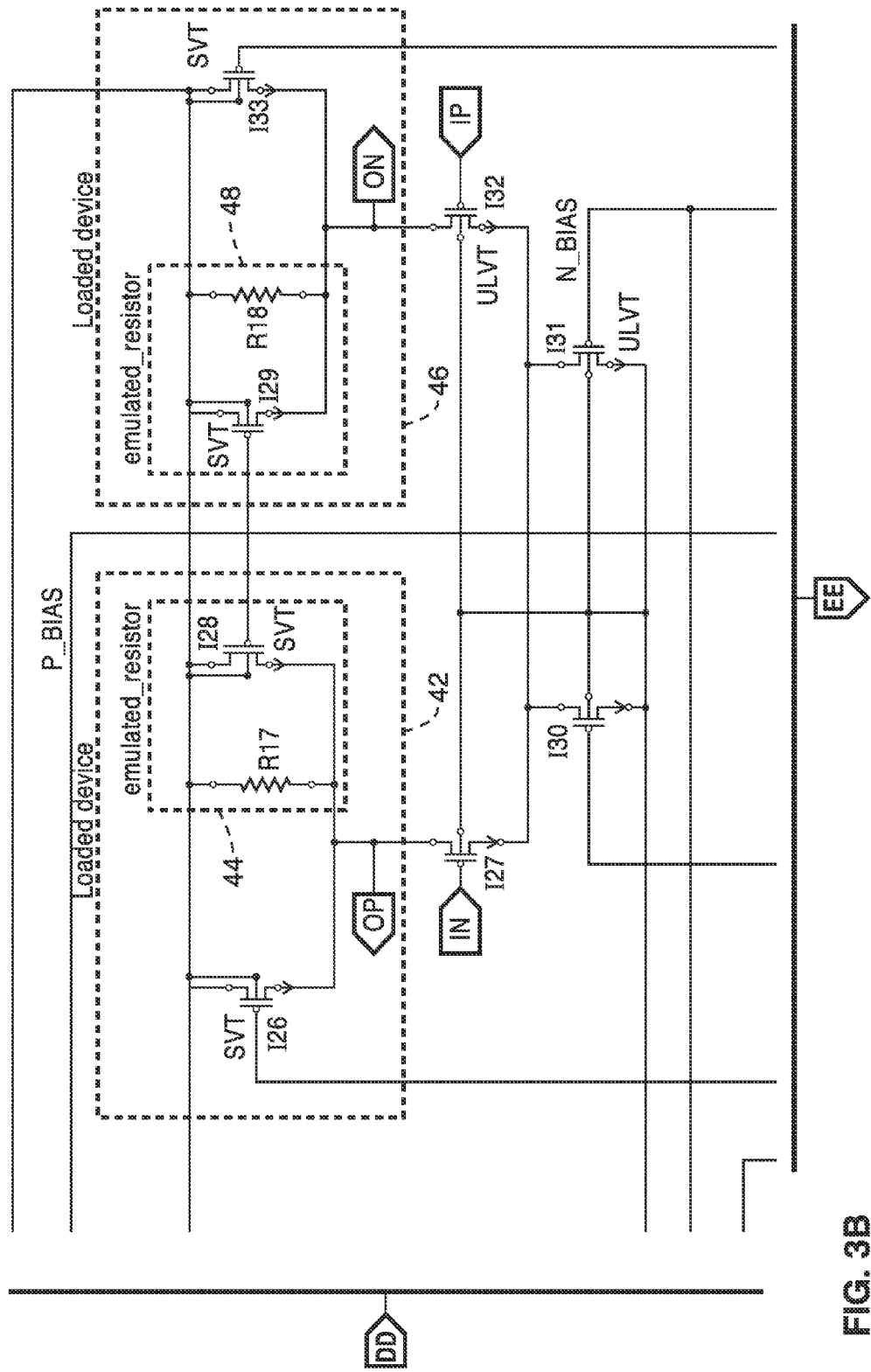
Figure 3C:
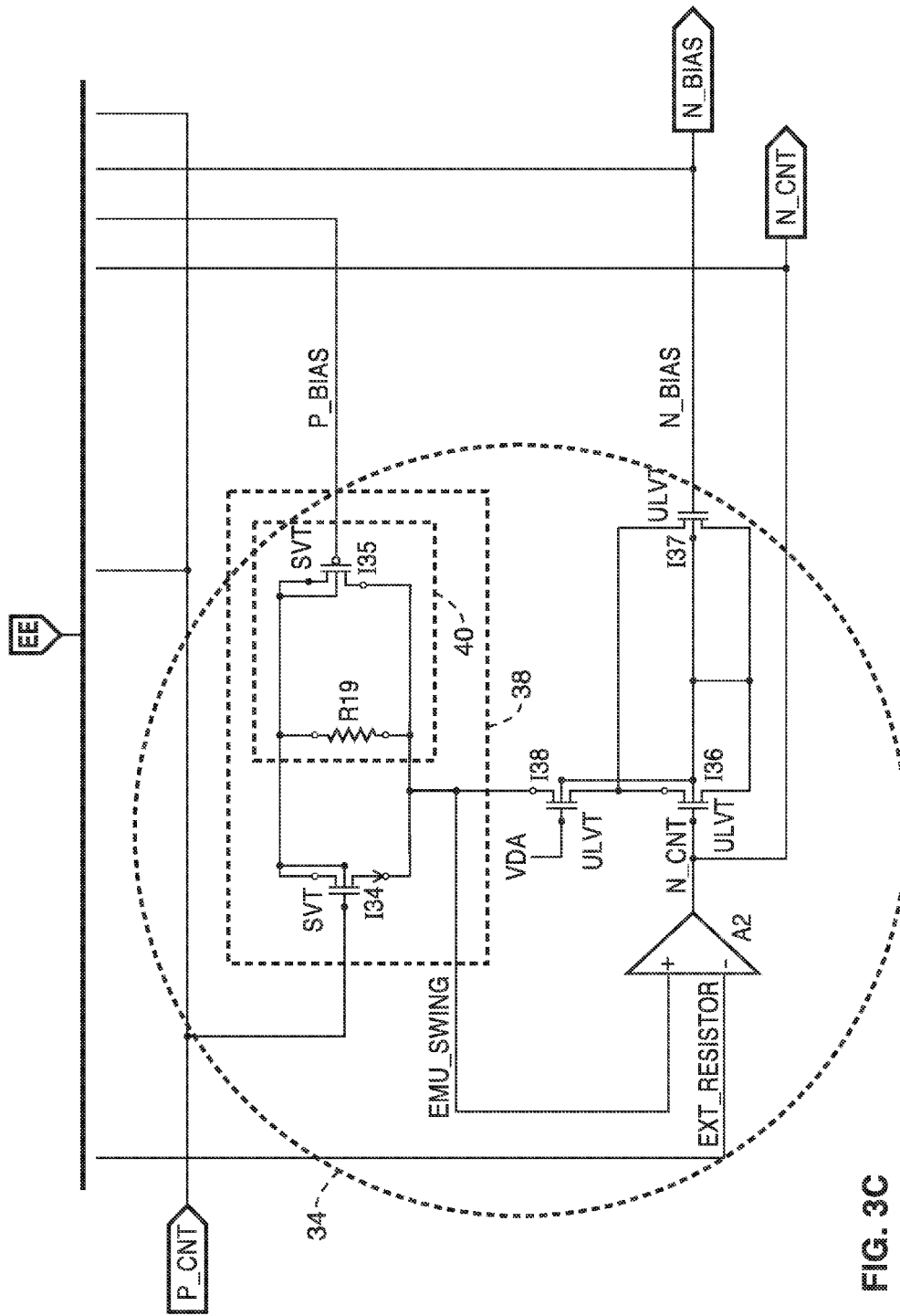

FIG. 3A through FIG. 3C illustrate transistor level implementation examples of portions of FIG. 1. In FIG. 3A, an example embodiment 30 of a transistor level implementation of resistor emulator circuit (block 16 of FIG. 1) and an external resistor circuit (block 18 of FIG. 1) seen in FIG. 1 are illustrated. In FIG. 3B, an example embodiment of a transistor level CML inverter that provides process tracking (blocks 22a through 22f of FIG. 2A through FIG. 2D) is illustrated. In FIG. 3C an example embodiment 34 of a transistor level implementation of the adaptive bias current generator circuit (block 14 seen in FIG. 1) is illustrated. These sections are highly interdependent as will be seen from the discussions below.

In FIG. 3A, an emulator 32 is shown with emulated resistor 36 seen having actual resistance R1 and transistor I23 gated by feedback amplifier A1 having an input coupled to the external resistor (EXT_RESISTOR) R16, and shown coupled to current source 47, which is preferably an accurate current source. Source of the emulated resistor 36 is through series transistors I24 gated by VDA, and I25 gated by N_BIAS. The N_BIAS signal is seen at the gate of transistor I22 coupled to a current source 49 connected to VDA. In this circuit, when P_CNT changes, adaptive bias current generator circuit 14 (of FIG. 1) increases N_CNT of FIG. 3B through negative feedback (by feedback amplifier A2) to keep the voltage swing equal to reference voltage EXT_RESISTOR.

In FIG. 3B, it is seen that the CML inverter comprises two loaded devices 42, 46, two switches (NMOS) I27, I28, and two current sources (NMOS) I30, I31. The loaded devices 42, 46 each consist of three parallel circuit elements, one resistor (R17, R18) combined with PMOS transistors I28, I29 for compensating for process variation of emulated resistor 44, 48. PMOS transistors I26, I33 adjust for tuning frequency. Of the two current source NMOS transistors, I31 provides a fixed current that is programmed to compensate for process variation, while current in the other, I30, changes as P_CNT changes to keep the voltage swing as a constant to tune the frequency of VCO over its tunable range. Transistors I27 and I32 perform switching to control which branch the current will pass through for the current steering operation.

P_CNT is pulled to VDD when the low pass filter pulls VCT close to VDD. When this happens, the resistance of the loaded device of CML inverter 42, 46 changes to a maximum because the PMOS transistors I26, I33 are turned off. In this case, N_CNT cuts off the current. As a result, CML inverter 22 always operates with the same voltage swing at the highest resistance and lowest current source. One can assure that CML (e.g., 22a through 22f in FIG. 2A through FIG. 2D) operates at its lowest possible oscillating frequency under this condition.

In FIG. 3B, the circuit depicts a transistor level diagram of combining adaptive bias current generator 34 into resistor emulator 30 to keep bias point of EMU_EXT and EMU_Swing to be constant while P_CNT changes to tune the VCO frequency.

Referring now to FIG. 3C, when P_CNT turns off PMOS transistors I26, I33 the emulated resistor circuit 16 generates P_BIAS received in FIG. 3C, such that the effective resistance of the loaded device, (parallel resistors R17, R18 in FIG. 3B), and PMOS transistor I28, I29 will always equal the fixed voltage across the loaded device divided by the programmable current in the resistor emulator circuit 30. The fixed voltage across the loaded device 42, 46 is achieved through differential amplifier A2 (in FIG. 3C) and its feedback. Because this refers to an external resistor R16 with a fixed current source 47 (FIG. 3A), the voltage across the loaded device 36 will remain a constant over the range of operating conditions (equals to the reference voltage EXT_RESISTOR produced by current of accurate current source 47 flowing through accurate external resistor R16) and process variations. If there is a change in resistance or PMOS characteristic, the resistor emulator circuit 16 adjusts P_BIAS by feedback circuits 30 to produce an effective resistance of loaded device equal to that of fixed voltage across the device divided by current source. Through this method, the apparatus always produces a target-effective resistance regardless of process variation. Combining the calibration controller 54, resistor emulator circuit 16 can compensate for different operation conditions with process variation.

Referring to FIG. 3C, P_BIAS is received by transistor I35 of a process-tracking replica load device 40 including resistor R19. Block 40 is part of complete replica load 38, which includes transistor I34 gated by P_CNT, and sourced through dummy switch transistor I38 which is gated by VDA, and current source transistor I36 gated by N_CNT, output by a feedback amplifier A2 receiving signals for emulator swing (EMU_SWING) and external resistor (EXT_RESISTOR). A second current source transistor I37 mirrors current from current source I25 in FIG. 3A, and is in parallel with I36 and gated by N_BIAS.

Referring back to the overall schematic of FIG. 1, the adaptive bias current generator circuit 14 changes the supply current of the CML inverter when P_CNT changes. This is necessary for the main function of the voltage control oscillator; specifically for changing output frequency in response to a changing control voltage. Resistor emulator circuit 16 defines the minimum current to the CML inverter, which guarantees the constant swing of the CML inverter when PMOS devices I26, I33 are turned off by P_CNT. Adaptive bias current generator 14 changes the supply current according to PMOS transistors I26, I33 biased by P_CNT.

Referring back to FIG. 3A through FIG. 3C, it is shown in FIG. 3B that the CML inverter has two current supplies: one NMOS I31 is biased by resistor emulator circuit 16 (minimum supply current), and the other NMOS I30 is biased by adaptive bias current generator circuit 14 (variation of current to change the Td). When P_CNT changes from high to low, resistance of PMOS biased by P_CNT I26, I33 in loaded devices 42, 46 decreases. As a result, the total resistance of the loaded device 42, 46 decreases. But the adaptive bias current generator circuit 14 ensures that the voltage drop across loaded devices 42, 46 is constant. In FIG. 3A, when P_CNT changes, adaptive bias current generator circuit 14 (of FIG. 1) increases N_CNT of FIG. 3B through negative feedback (by feedback amplifier A2) to keep the voltage swing equal to reference voltage EXT_RESISTOR. Increases of N_CNT causes an increase in the NMOS supply current in the CML inverter (e.g., 22a through 22f of FIG. 2A through FIG. 2D) by increasing the current flowing through the NMOS device I30, while the swing of the CML inverter is unchanged. Thus, the CML inverter can change its delay time when P_CNT changes, which is expressed by Eq. (2), where swing and node capacitance are constant while supply current changes.

Figure 4:
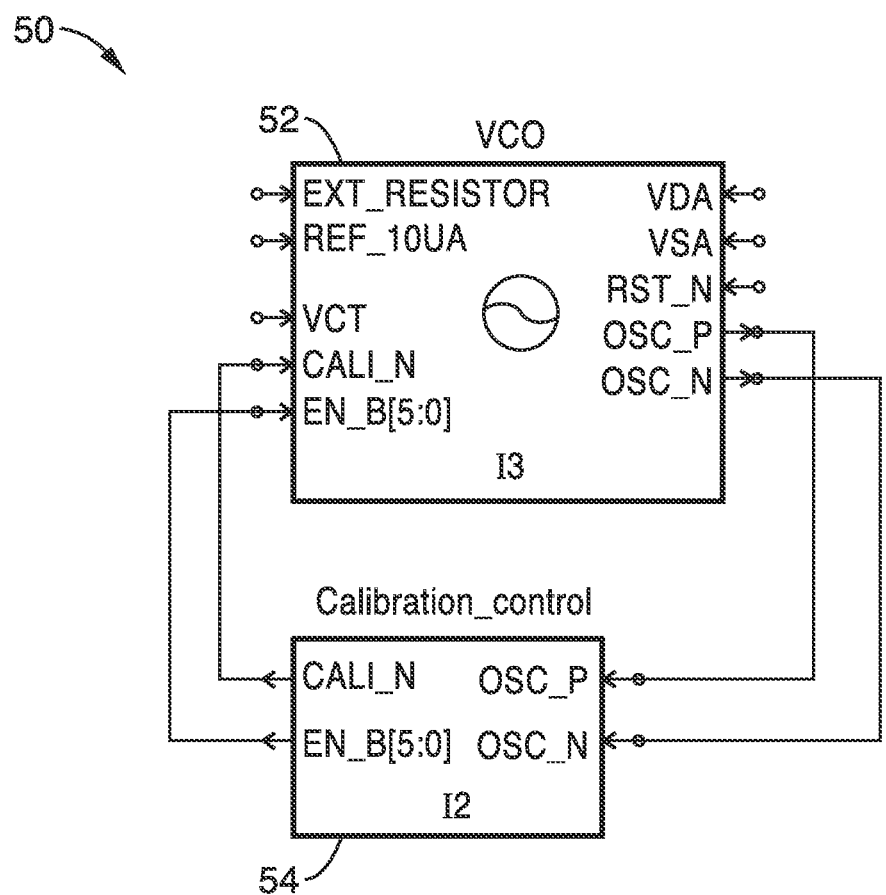
FIG. 4 is a calibration circuit shown coupled to the voltage controlled oscillator (VCO), according to an embodiment of the present invention.

FIG. 4 illustrates an example embodiment 50 of a calibration control circuit 54 configured for operation within the VCO 52 according to an embodiment of the present invention. Although shown as a separate circuit in this embodiment, it should be appreciated that the calibration circuit can be integrated within embodiments of the VCO, without departing from the teachings of the present invention.

The calibration control 54 is shown configured to receive VCO oscillator output signal pair OSC_P and OSC_N, and to generate output signals CALI_N and EN_B[5:0] to the VCO. VCO 52 is shown with the same I/O as seen in FIG. 1, including EXT_RESISTOR, REF_10 UA, VCT, CALI_N, EN_B[5:0], VDA, VSA, RST_N, OSC_P, and OSC_N.

Referring again to FIG. 4, control pin CALI_N is a control mechanism for self calibration to signal circuit 14 (vct_2_pct) to enter a calibration mode. A group of digital bits EN_B[5:0] are output from the calibration circuit for controlling resistor emulation by circuit 16 seen in FIG. 1. In this example embodiment, the circuit has a 6 bit programming control (EN_B[5:0]); although it should be appreciated that any desired level of quantization, and thus number of control bits, can be utilized for a given VCO application without departing from the teachings of the present invention. It should be noted that the target frequency range is set according to the specification of a given application. The calibration process is described in more detail in FIG. 5.

Figure 5:
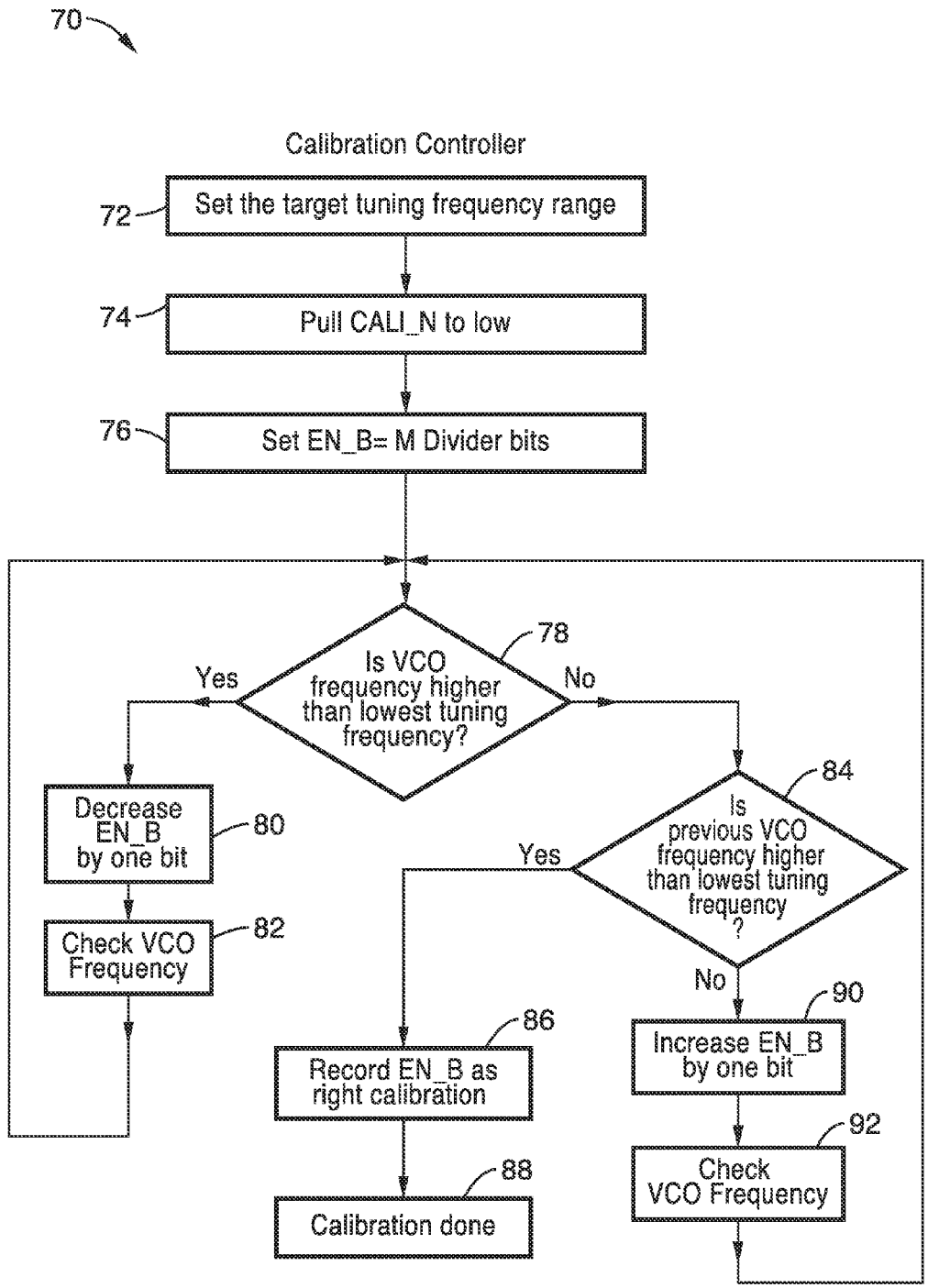
FIG. 5 is a flow diagram of a calibration sequence for the voltage controlled oscillator (VCO) according to an embodiment of the present invention.

FIG. 5 illustrates an example embodiment 70 of VCO calibration within the present invention. A target tuning range must first be established (set) 72 for the device. By way of example and not limitation, the range can be stored depending on the application, such as in ROM, initialization registers, or other retention structure, and is read when calibration starts. The calibration controller operation starts the calibration process by asserting 74 the CALI_N signal (e.g., to low). In response, the controller will pull P_CNT in FIG. 1 to high to turn off (minimize conductance) the PMOS transistors in the ring oscillator 20 through circuit 12. The CML inverters in ring oscillator 20 (seen with stages 22a, 22b, 22c, 22d, 22e, 22f in FIG. 2) then operate with the longest delay; in other words, the CML inverter will oscillate at the lowest frequency. By adjusting 76 the digital value represented by EN_B[5:0], the calibration controller adjusts the lowest frequency close to the lowest target tuning frequency. For a given EN_B configuration, if the frequency of VCO is higher than the lowest tuning frequency 78, the algorithm decreases EN_B 80, and checks the frequency again 82, and back to 78 to check VCO frequency. If it is determined 78 that the VCO frequency is not higher than the lowest tuning frequency, then a check is made 84 if the previous configuration of EN_B makes VCO frequency higher than the lowest tuning frequency. If yes, then current EN_B is recorded as the correct configuration 86 and calibration is completed 88. Otherwise, if the determination at block 84 is No, then previous VCO value is increased by increasing EN_B by one bit 90 and VCO frequency is checked again 92, before returning to block 78.

From the discussion above it will be appreciated that the invention can be embodied in various ways, including the following:

1. A voltage controlled oscillator (VCO) apparatus, comprising: a ring oscillator comprising multiple digital stages of current mode logic (CML) inverters to generate an oscillation frequency; a resistor emulator that emulates an external resistor device which is constant despite fabrication process variation; a self calibration controller circuit that in its calibration mode adjusts resistance provided by said resistor emulator to create a RC delay in said current mode logic (CML) inverters according to target running frequency of said VCO apparatus; an amplifier configured for amplifying an input control voltage to the VCO and outputting a first control voltage to said ring oscillator; and an adaptive bias current generator circuit configured for adjusting bias current by providing a second control voltage to said ring oscillator, said adaptive bias current generator performs automatic feedback control based on said resistor emulator and input control voltage of VCO to control both frequency and output swing of said ring oscillator; whereby said VCO apparatus generates a frequency output proportional to said input control voltage with reduced impact from fabrication process variation.

2. The apparatus of any of the previous embodiments, wherein frequency of the VCO apparatus is inversely proportional to twice the sum of the delays in each of said multiple digital stages of said ring inverter.

3. The apparatus of any of the previous embodiments, wherein changes in said first control voltage from said amplifier changes delay times in each of said multiple digital stages of current mode logic (CML) inverters in said ring oscillator and thus changes output frequency of said VCO apparatus.

4. The apparatus of any of the previous embodiments, wherein changes in said second control voltage changes resistance of loaded devices in each digital stage of said multiple digital stages of current mode logic (CML) inverters in said ring oscillator to maintain a desired voltage swing.

5. The apparatus of any of the previous embodiments, wherein said resistor emulator circuit is configured to receive one or more programming control signals from said self calibration controller circuit.

6. The apparatus of any of the previous embodiments, wherein said programming control signals comprise a plurality of digital bits to control differential bias current output under a fixed voltage swing.

7. The apparatus of any of the previous embodiments, wherein operation of said ring oscillator depends upon current steering in response to use of differential signals of said current mode logic (CML).

8. The apparatus of any of the previous embodiments, wherein said ring oscillator further comprises an output buffer configured to increase the size of loads to be driven.

9. The apparatus of any of the previous embodiments, wherein said ring oscillator further comprises a starter circuit which ties internal nodes of said ring oscillator to a proper voltage for starting oscillations of said ring oscillator.

10. The apparatus of any of the previous embodiments, wherein said resistor emulator receives input from an external resistor and an external reference current source.

11. The apparatus of any of the previous embodiments, wherein by maintaining voltage swing in said digital stages of said ring oscillator as a constant so that the voltage swing does not change in response to process variation, the circuit programs an amount of current provided by said resistor emulator circuit to compensate for capacitance loading changes in said ring oscillator due to process variation, thus frequency gain by control voltage of the VCO apparatus is kept smaller for a given tuning range, because the process variation has been compensated for.

12. The apparatus of any of the previous embodiments, whereby in response to minimizing the frequency gain by control voltage, the VCO apparatus achieves lower VCO jitter for a given amount of process variation.

13. The apparatus of any of the previous embodiments, wherein said ring oscillator utilizes a significantly smaller chip area than an L-C tank circuit.

14. The apparatus of any of the previous embodiments, wherein said VCO apparatus is utilized in a circuit, as selected from a group of circuits consisting of frequency modulation (FM), phase modulation (PM), phase-locked loop (PLL), function generator, tone generator, music generator, clock and data recover (CDR) circuit, frequency synthesizers, frequency synthesizers in communication equipment, and voltage to frequency converters.

15. An voltage controlled oscillator (VCO) apparatus, comprising: a ring oscillator comprising multiple digital stages of current mode logic (CML) inverters to generate an oscillation frequency; a resistor emulator that emulates an external resistor device which is constant despite fabrication process variation; a self calibration controller circuit that in its calibration mode adjusts resistance provided by said resistor emulator to create an RC delay in said current mode logic (CML) inverters inside said ring oscillator according to target running frequency of said VCO apparatus; an amplifier configured for amplifying an input control voltage to the VCO and outputting a first control voltage to said ring oscillator; and an adaptive bias current generator circuit configured for adjusting bias current by providing a second control voltage to said ring oscillator, said adaptive bias current generator performs automatic feedback control based on said resistor emulator and input control voltage of VCO to control both frequency and output swing of said ring oscillator; wherein changes in said first control voltage changes delay times in each of said multiple digital stages of current mode logic (CML) inverters in said ring oscillator and thus changes output frequency of said VCO apparatus; wherein changes in said second control voltage changes resistance of loaded devices in each digital stage of said multiple digital stages of current mode logic (CML) inverters in said ring oscillator to maintain a desired voltage swing; wherein said adaptive bias current generator performs automatic feedback control based on input from said resistor emulator to control both frequency and output swing of said ring oscillator; and whereby said VCO apparatus generates a frequency output proportional to said input control voltage with reduced impact from fabrication process variation.

16. The apparatus of any of the previous embodiments, wherein frequency of the VCO apparatus is inversely proportional to twice the sum of the delays in each of said multiple digital stages of said ring inverter.

17. The apparatus of any of the previous embodiments, wherein said ring oscillator further comprises an output buffer configured to increase the size of loads to be driven, and a starter circuit which ties internal nodes of said ring oscillator to a proper voltage for starting oscillations of said ring oscillator.

18. The apparatus of any of the previous embodiments, wherein by maintaining voltage swing in said digital stages of said ring oscillator as a constant so that the voltage swing does not change in response to process variation, the circuit programs an amount of current provided by said resistor emulator circuit to compensate for capacitance loading changes in said ring oscillator due to process variation, thus frequency gain by control voltage of the VCO apparatus is kept smaller for a given tuning range, because the process variation has been compensated for, and thus a lower VCO jitter is achieved for a given amount of process variation.

19. The apparatus of any of the previous embodiments, wherein said VCO apparatus is utilized in a circuit, as selected from a group of circuits consisting of frequency modulation (FM), phase modulation (PM), phase-locked loop (PLL), function generator, tone generator, music generator, clock and data recover (CDR) circuit, frequency synthesizers, frequency synthesizers in communication equipment, and voltage to frequency converters.

20. A voltage controlled oscillator (VCO) apparatus, comprising: a ring oscillator comprising multiple digital stages of current mode logic (CML) inverters to generate an oscillation frequency; an output buffer in said ring oscillator is configured to increase the size of loads to be driven; a starter circuit in said ring oscillator that ties internal nodes of said ring oscillator to a proper voltage for starting oscillations of said ring oscillator; a resistor emulator that emulates an external resistor device which is constant despite fabrication process variation; a self calibration controller circuit that in its calibration mode adjusts resistance provided by said resistor emulator to create a constant RC delay for each stage of current mode logic (CML) inverters inside said ring oscillator; an amplifier configured for amplifying an input control voltage to the VCO and outputting first control voltage to said ring oscillator; and an adaptive bias current generator circuit configured for adjusting bias current by providing a second control voltage to said ring oscillator, said adaptive bias current generator performs automatic feedback control based on said resistor emulator and input control voltage of VCO to control both frequency and output swing of said ring oscillator; wherein changes in said first control voltage change delay times in each of said multiple digital stages of current mode logic (CML) inverters in said ring oscillator and thus changes output frequency of said VCO apparatus; wherein changes in said second control voltage changes resistance of loaded devices in each digital stage of said multiple digital stages of current mode logic (CML) inverters in said ring oscillator to maintain a desired voltage swing; wherein said adaptive bias current generator performs automatic feedback control based on input from said resistor emulator to control both frequency and output swing of said ring oscillator; wherein by maintaining voltage swing in said digital stages of said ring oscillator as a constant so that the voltage swing does not change in response to process variation, the circuit programs an amount of current provided by said resistor emulator circuit to compensate for capacitance loading changes in said ring oscillator due to process variation, thus frequency gain by control voltage of the VCO apparatus is kept smaller for a given tuning range, because the process variation has been compensated for, and thus a lower VCO jitter is achieved for a given amount of process variation; and whereby said VCO apparatus generates a frequency output proportional to said input control voltage with reduced impact from fabrication process variation.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A voltage controlled oscillator (VCO) apparatus, comprising:
   a ring oscillator comprising multiple digital stages of current mode logic (CML) inverters to generate an oscillation frequency;
   a resistor emulator that emulates an external resistor device which is constant despite fabrication process variation;
   a self calibration controller circuit that in its calibration mode adjusts resistance provided by said resistor emulator to create a RC delay in said current mode logic (CML) inverters according to target running frequency of said VCO apparatus;
   an amplifier configured for amplifying an input control voltage to the VCO and outputting a first control voltage to said ring oscillator; and
   an adaptive bias current generator circuit configured for adjusting bias current by providing a second control voltage to said ring oscillator, said adaptive bias current generator performs automatic feedback control based on said resistor emulator and input control voltage of VCO to control both frequency and output swing of said ring oscillator;
   whereby said VCO apparatus generates a frequency output proportional to said input control voltage with reduced impact from fabrication process variation.

2. The apparatus recited in claim 1, wherein frequency of the VCO apparatus is inversely proportional to twice the sum of the delays in each of said multiple digital stages of said ring inverter.

3. The apparatus recited in claim 1, wherein changes in said first control voltage from said amplifier changes delay times in each of said multiple digital stages of current mode logic (CML) inverters in said ring oscillator and thus changes output frequency of said VCO apparatus.

4. The apparatus recited in claim 1, wherein changes in said second control voltage changes resistance of loaded devices in each digital stage of said multiple digital stages of current mode logic (CML) inverters in said ring oscillator to maintain a desired voltage swing.

5. The apparatus recited in claim 1, wherein said resistor emulator circuit is configured to receive one or more programming control signals from said self calibration controller circuit.

6. The apparatus recited in claim 5, wherein said programming control signals comprise a plurality of digital bits to control differential bias current output under a fixed voltage swing.

7. The apparatus recited in claim 1, wherein operation of said ring oscillator depends upon current steering in response to use of differential signals of said current mode logic (CML).

8. The apparatus recited in claim 1, wherein said ring oscillator further comprises an output buffer configured to increase the size of loads to be driven.

9. The apparatus recited in claim 1, wherein said ring oscillator further comprises a starter circuit which ties internal nodes of said ring oscillator to a proper voltage for starting oscillations of said ring oscillator.

10. The apparatus recited in claim 1, wherein said resistor emulator receives input from an external resistor and an external reference current source.

11. The apparatus recited in claim 1, wherein by maintaining voltage swing in said digital stages of said ring oscillator as a constant so that the voltage swing does not change in response to process variation, the circuit programs an amount of current provided by said resistor emulator circuit to compensate for capacitance loading changes in said ring oscillator due to process variation, thus frequency gain by control voltage $K_{VCO}$ of the VCO apparatus is kept smaller for a given tuning range, because the process variation has been compensated for.

12. The apparatus recited in claim 11, whereby in response to minimizing the frequency gain by control voltage $K_{VCO}$, the VCO apparatus achieves lower VCO jitter for a given amount of process variation.

13. The apparatus recited in claim 1, wherein said ring oscillator utilizes a significantly smaller chip area than an L-C tank circuit.

14. The apparatus recited in claim 1, wherein said VCO apparatus is utilized in a circuit, as selected from a group of circuits consisting of frequency modulation (FM), phase modulation (PM), phase-locked loop (PLL), function generator, tone generator, music generator, clock and data recover (CDR) circuit, frequency synthesizers, frequency synthesizers in communication equipment, and voltage to frequency converters.

15. A voltage controlled oscillator (VCO) apparatus, comprising:
a ring oscillator comprising multiple digital stages of current mode logic (CML) inverters to generate an oscillation frequency;
a resistor emulator that emulates an external resistor device which is constant despite fabrication process variation;
a self calibration controller circuit that in its calibration mode adjusts resistance provided by said resistor emulator to create an RC delay in said current mode logic (CML) inverters inside said ring oscillator according to target running frequency of said VCO apparatus;
an amplifier configured for amplifying an input control voltage to the VCO and outputting a first control voltage to said ring oscillator; and
an adaptive bias current generator circuit configured for adjusting bias current by providing a second control voltage to said ring oscillator, said adaptive bias current generator performs automatic feedback control based on said resistor emulator and input control voltage of VCO to control both frequency and output swing of said ring oscillator;
wherein changes in said first control voltage changes delay times in each of said multiple digital stages of current mode logic (CML) inverters in said ring oscillator and thus changes output frequency of said VCO apparatus;
wherein changes in said second control voltage changes resistance of loaded devices in each digital stage of said multiple digital stages of current mode logic (CML) inverters in said ring oscillator to maintain a desired voltage swing;
wherein said adaptive bias current generator performs automatic feedback control based on input from said resistor emulator to control both frequency and output swing of said ring oscillator; and
whereby said VCO apparatus generates a frequency output proportional to said input control voltage with reduced impact from fabrication process variation.

16. The apparatus recited in claim 15, wherein frequency of the VCO apparatus is inversely proportional to twice the sum of the delays in each of said multiple digital stages of said ring inverter.

17. The apparatus recited in claim 15, wherein said ring oscillator further comprises an output buffer configured to increase the size of loads to be driven, and a starter circuit which ties internal nodes of said ring oscillator to a proper voltage for starting oscillations of said ring oscillator.

18. The apparatus recited in claim 15, wherein by maintaining voltage swing in said digital stages of said ring oscillator as a constant so that the voltage swing does not change in response to process variation, the circuit programs an amount of current provided by said resistor emulator circuit to compensate for capacitance loading changes in said ring oscillator due to process variation, thus frequency gain by control voltage $K_{VCO}$ of the VCO apparatus is kept smaller for a given tuning range, because the process variation has been compensated for, and thus a lower VCO jitter is achieved for a given amount of process variation.

19. The apparatus recited in claim 15, wherein said VCO apparatus is utilized in a circuit, as selected from a group of circuits consisting of frequency modulation (FM), phase modulation (PM), phase-locked loop (PLL), function generator, tone generator, music generator, clock and data recover (CDR) circuit, frequency synthesizers, frequency synthesizers in communication equipment, and voltage to frequency converters.

20. A voltage controlled oscillator (VCO) apparatus, comprising:
a ring oscillator comprising multiple digital stages of current mode logic (CML) inverters to generate an oscillation frequency;
an output buffer in said ring oscillator is configured to increase the size of loads to be driven;
a starter circuit in said ring oscillator that ties internal nodes of said ring oscillator to a proper voltage for starting oscillations of said ring oscillator;
a resistor emulator that emulates an external resistor device which is constant despite fabrication process variation;
a self calibration controller circuit that in its calibration mode adjusts resistance provided by said resistor emulator to create a constant RC delay for each stage of current mode logic (CML) inverters inside said ring oscillator;
an amplifier configured for amplifying an input control voltage to the VCO and outputting first control voltage to said ring oscillator; and
an adaptive bias current generator circuit configured for adjusting bias current by providing a second control voltage to said ring oscillator, said adaptive bias current generator performs automatic feedback control based on said resistor emulator and input control voltage of VCO to control both frequency and output swing of said ring oscillator;
wherein changes in said first control voltage change delay times in each of said multiple digital stages of current mode logic (CML) inverters in said ring oscillator and thus changes output frequency of said VCO apparatus;
wherein changes in said second control voltage changes resistance of loaded devices in each digital stage of said multiple digital stages of current mode logic (CML) inverters in said ring oscillator to maintain a desired voltage swing;
wherein said adaptive bias current generator performs automatic feedback control based on input from said resistor emulator to control both frequency and output swing of said ring oscillator;
wherein by maintaining voltage swing in said digital stages of said ring oscillator as a constant so that the voltage swing does not change in response to process variation, the circuit programs an amount of current provided by said resistor emulator circuit to compensate for capacitance loading changes in said ring oscillator due to process variation, thus frequency gain by control voltage $K_{VCO}$ of the VCO apparatus is kept smaller for a given tuning range, because the process variation has been compensated for, and thus a lower VCO jitter is achieved for a given amount of process variation; and
whereby said VCO apparatus generates a frequency output proportional to said input control voltage with reduced impact from fabrication process variation.

* * * * *